United States Patent [19]

Shiraki et al.

[11] Patent Number: 4,559,547
[45] Date of Patent: Dec. 17, 1985

[54] SEMICONDUCTOR DEVICE

[75] Inventors: Yasuhiro Shiraki, Hino; Yoshimasa Murayama, Koganei; Yoshifumi Katayama, Tokorozawa; Eiichi Maruyama, Kodaira, all of Japan

[73] Assignee: Hitachi, Ltd., Tokyo, Japan

[21] Appl. No.: 444,233

[22] Filed: Nov. 24, 1982

[30] Foreign Application Priority Data

Nov. 27, 1981 [JP] Japan ................. 56-189339

[51] Int. Cl.$^4$ ................................. H01L 29/78
[52] U.S. Cl. ........................ 357/23.2; 357/23.7; 357/15; 357/16; 357/22
[58] Field of Search ............. 357/23.2, 22, 15, 16, 357/23.7

[56] References Cited

U.S. PATENT DOCUMENTS

| | | | |
|---|---|---|---|
| 4,157,556 | 6/1979 | Decker et al. | 357/16 |
| 4,236,166 | 11/1980 | Cho et al. | 357/15 |
| 4,424,525 | 1/1984 | Mimura | 357/15 |
| 4,455,564 | 6/1984 | Delagebeaudeuf | 357/15 |
| 4,471,366 | 9/1984 | Delagebeaudeuf et al. | 357/16 |

Primary Examiner—Martin H. Edlow
Attorney, Agent, or Firm—Antonelli, Terry & Wands

[57] ABSTRACT

The semiconductor device of the present invention is characterized by a device consisting of at least a heterojunction formed by the first semiconductor layer and the second semiconductor layer where the forbidden band gap of the said first semiconductor is smaller than that of the said second semiconductor, at least one pair of electrode regions connected electronically to the said first semiconductor and a means to control the carrier density in the said first semiconductor layer where the impurities are not included effectively in the region in the first semiconductor under the means to control the carriers and are included in the region adjacent to the said one pair of electrodes. The density of the impurities in these region are preferably be larger than $10^{16}\,\text{cm}^{-3}$.

21 Claims, 11 Drawing Figures

SEMICONDUCTOR DEVICE

BACKGROUND OF THE INVENTION

1. Field of the Invention

The present invention relates to semiconductor devices with enhanced mobility.

2. Description of the Prior Art

Gallium arsenide (GaAs) is an appropriate material for high speed semiconductor devices, because electron mobility in GaAs is extremely high compared with that in silicon (Si). However, MOS (Metal-Oxide-Semiconductor) type field-effect-transistor corresponding to the Si-MOS transistor has not been realized in GaAs because of the difficulty in growing an insulating layer with good quality.

On the other hand, it has recently been known that a field-effect transistor can be fabricated by using aluminum gallium arsenide (AlGaAs) instead of an insulating layer to induce carriers at the GaAs-AlGaAs interfaces. Examples of such fabrication techniques are published in JAPANESE JOURNAL OF APPLIED PHYSICS, Vol. 19, No. 5, May, 1980, pp. L225-L227 and MICROWAVES, October, 1980, p. 20.

FIG. 1 shows the energy band diagram of the active region of this transistor using AlGaAs. 13, 12, and 11 denote the gate electrode, the doped AlGaAs layer, and the substantially undoped GaAs layer, respectively. $F_E$ designates the Fermi level. This figure illustrates the state where the carriers which are denoted by 15 are confined in a two-dimensional potential well parallel to the plane of the interface. The carriers 15 are provided by the donor levels 14 in AlGaAs layer 12, and transit in the undoped GaAs layer 11. Namely, the carriers are separated spacially from ionized donor impurities. Accordingly, the probability of carrier scattering by ionized impurity potential will be decreased, and as a result the mobility of the electron becomes high.

However, in the transistor of such structure with this high electron mobility, the transconductance becomes small, because the gate voltage is not effectively applied to the interface due to the large number of donors that are added.

SUMMARY OF THE INVENTION

The first object of this invention is to provide a semiconductor device with an enhanced electron mobility.

The other object of this invention is to provide a semiconductor device containing transistors of both enhancement and depletion modes which can be fabricated in a simple procedure.

These objects have been attained by the following construction.

The semiconductor device of the present invention comprises, at least, a hetero-junction formed by a first semiconductor layer and a second semiconductor layer, where the forbidden band gap of the material of said first semiconductor layer is smaller than that of the material of said second semiconductor layer. The device also comprises, at least, one pair of electrode regions connected electronically to said first semiconductor layer; and means for controlling the carrier density in said first semiconductor layer, where impurities are not included substantially in the region in the first semiconductor layer under the means for controlling the carriers and are included in the region adjacent to the pair of electrodes. The density of the impurities, in these regions including impurities, is preferably larger than $10^{16}$ cm$^{-3}$.

The semiconductor device of this invention has the following advantages, with this structure.

(1) The mobility of the carriers is enhanced due to the absence of impurities near the channel in the first semiconductor layer, which impurities act as scattering centers.

(2) The transconductance is enhanced as the gate voltage is effectively applied to the channel by utilizing the undoped second semiconductor layer as an equivalent to the insulating layer in MOS transistors.

(3) As carriers are provided from the region containing impurities (which are formed adjacent to the electrodes), to the gaps between the channel and pair of electrodes (which pair of electrodes are in common called source and drain electrodes in the case of MOS transistors), the channel and the said electrodes are favorably connected. Accordingly, the transistor of this invention operates with extremely good performance.

DETAILED DESCRIPTION OF THE INVENTION

The present invention is explained in detail by referring to an example where the said first semiconductor layer is a GaAs layer and the second semiconductor layer is an AlGaAs layer. Here, AlGaAs means $Al_{x}Ga_{1-x}As$ ($0 \leq x \leq 1$).

In a field-effect transistor with AlGaAs-GaAs heterostructure, the energy difference of the conduction band edges in GaAs and AlGaAs at the interface is about 0.3 eV and the Schottky barrier height is about 0.6 eV. Accordingly, when undoped AlGaAs is used, a conduction channel is not formed without applying a gate voltage.

Figure 1:
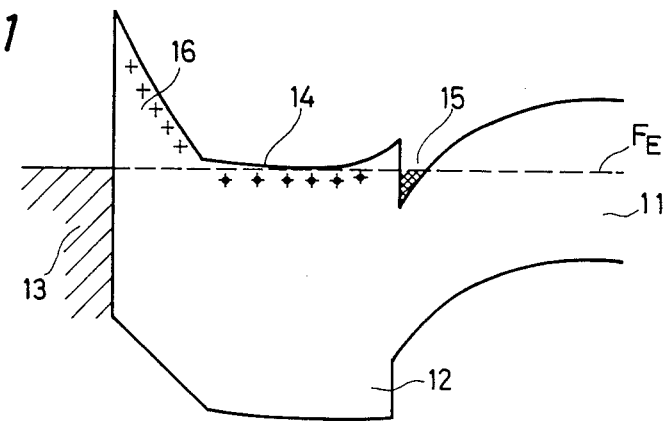
FIG. 1 shows the energy diagram of a conventional heterojunction field-effect transistor.
Figure 2A:
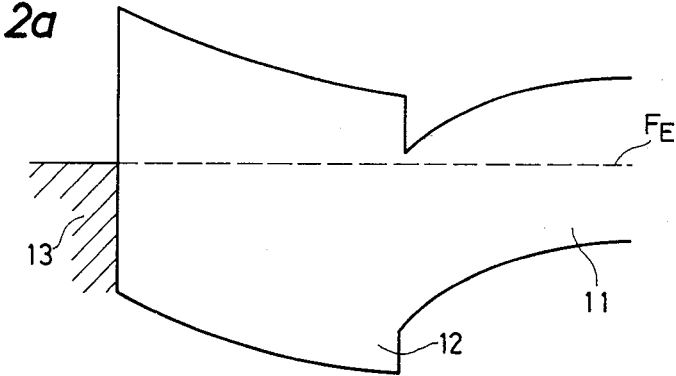
FIG. 2a shows the energy diagram of a transistor in accordance with this invention.

FIG. 2a shows the energy band structure for such cases. The symbols 13, 12, 11 and $F_E$ represent the gate electrode, the AlGaAs layer, GaAs layer, and the Fermi level, respectively. In the case of FIG. 2a, the transistor is in a normally-off state and the channel is formed by the application of a gate voltage. That is, it becomes possible to construct a transistor which operates in an enhancement mode.

Figure 3A:
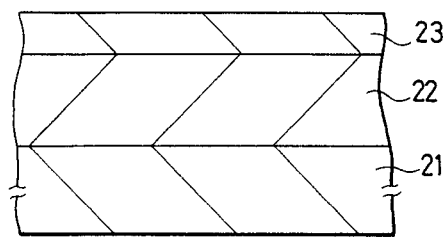
FIGS. 3a-3c show sectional views illustrating a fabrication process of the field-effect transistor.
Figure 3B:
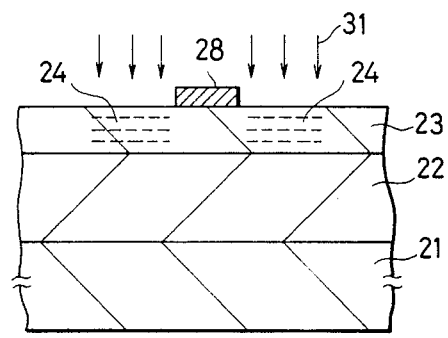
Figure 3C:
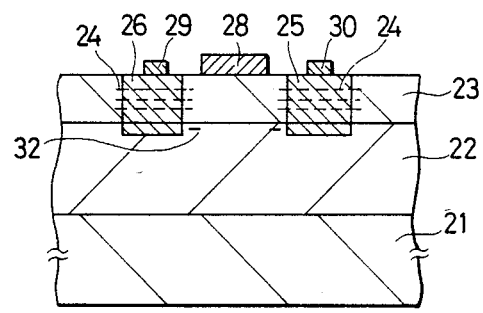

FIG. 3c shows the cross-sectional structure of a typical example of semiconductor devices of the present invention. The regions denoted by 21, 22, 23, 24, 25 and 26, 28, and 29 and 30, represent the GaAs substrate, the GaAs layer, the AlGaAs layer, the impurity-doped region adjacent to the electrode region, one pair of electrode regions, the control electrode (generally, gate electrode), and metal electrodes, respectively.

One or more semiconductor layers can be formed between the semiconductor substrate 21 and the first semiconductor layer 22, whenever necessary. These semiconductor layers are formed conventionally in order to improve the crystalline quality of the first semiconductor layer.

In the case of a non-doped semiconductor layer, the impurity density in the semiconductor layer is smaller than approximately $10^{15}$ cm$^{-3}$.

Furthermore, 32 represents the carriers induced near the hetero-interface. The channel and the electrode regions (25, 26) are favorably connected by these induced carriers.

The first semiconductor layer 22 is a substantially non-doped GaAs layer with a thickness of 0.2 to 5 μm, grown by a molecular beam epitaxy method (MBE). The second semiconductor layer is a substantially non-doped AlGaAs layer with an energy gap larger than that of GaAs by about 0.15–0.4 eV and with a thickness of 10 nm to 500 nm, which layer is grown by MBE.

The impurity-doped regions 24 adjacent to the electrode regions are formed by masked ion implantation of donor impurities such as Si ions. As donor impurities, in addition to Si, also germanium (Ge), tin (Sn), tellurium (Te), selenium (Se), sulfur (S), etc. are applicable. The dose level of the ion implantation is determined by the required characteristics of the device of interest. In many cases, the dose level of about $10^{13}$ to $10^{14}$ cm$^{-2}$ is used. The energy for the ion implantation ranges from 50 to 200 keV, depending upon the implant species. After ion implantation, specimens are annealed in an inert gas such as argon (Ar) and nitrogen (N$_2$), kept at 500° to 850° C. for 5 min. to 10 hours to activate the implanted species. The annealing temperature should not be too high, otherwise the AlGaAs-GaAs interface will be deteriorated. The source and drain electrode regions are formed by depositing, for example, Au-Ge alloy (200 nm)-Ni (10 nm)-Au-Ge alloy (300 nm) on the required portions and heating in a flowing hydrogen ambient of 400° C. for 5 min.

Figure 2B:
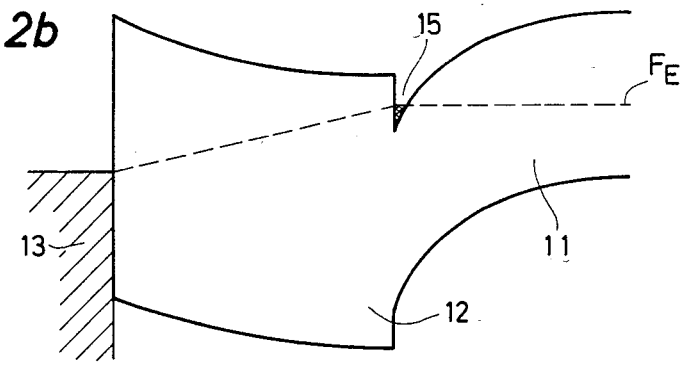
FIG. 2b shows the energy diagram of a transistor, of this invention, when in operation.

As is shown schematically in FIG. 2b, the carriers are induced in the channel region by applying a positive gate voltage with an appropriate magnitude. By applying an electric field between the source and drain electrodes, the electrons transit from the source region, through the region 32 adjacent to the source region where the carriers are induced due to ion implanted donors, the channel described above, and the region 32 adjacent to the drain region, and then to the drain electrode. This electric current is controlled by the gate voltage. That is, this semiconductor device operates as a field-effect transistor.

Although, in the example above, this invention was explained referring to a semiconductor device comprising a GaAs-AlGaAs system, this concept is applicable also to the hetero-junction systems comprising combinations of other materials such as Al$_y$Ga$_{1-y}$As-Al$_x$Ga$_{1-x}$As, GaAs-Al$_2$Ga$_{1-x}$As$_{1-y}$P$_y$, InP-In$_x$Ga$_{1-x}$-As$_y$P$_{1-y}$, InP-In$_x$Ga$_{1-x}$As, InAs-GaAs$_x$Sb$_{1-x}$, etc., where $0<x<1$ and $0<y<1$. In the case of the Al$_y$Ga$_{1-y}$As-Al$_x$Ga$_{1-x}$As system, it is preferable that $0<x<0.5$, $0<y<0.5$ and $x<y$.

The transistors of the present invention are very favorably integrated. That is, in case there arises a need for integrating depletion mode transistors with those of enhancement mode operation, at first one fabricates the enhancement mode transistors and implants donors into, e.g., AlGaAs regions under the gate electrodes for the transistors which should operate in the depletion mode. Such donors should be implanted to the dose level such that the transistors become the normally-on type.

In this case, to avoid unwanted influences of ion implantation, such as lattice defects generated by ion implantation and the increase of carrier scattering due to donor impurities implanted, it is important to implant ions so that the average project range may be located apart from the heterointerface by more than 30 nm. As the dose level of ion implantation can be precisely controlled and therefore ion implantation can be utilized as a most reliable technique for the threshold control of field-effect transistors, one can expect decreased dispersion of transistor characteristics, as compared with those of transistors fabricated by conventional threshold voltage control using an etching method.

EMBODIMENT 1

The main techniques for fabricating a semiconductor device of the present invention are shown in FIG. 3a to FIG. 3c. On a semi-insulating GaAs substrate 21, a non-doped GaAs layer 22 with a thickness of about 1 μm (generally, 0.2 to 5 μm) is deposited at a substrate temperature of 580° C. (generally, 500° to 850° C.) by a conventional molecular beam epitaxy method (MBE), and thereupon an AlGaAs layer 23 with a thickness of 120 nm (generally, 10 to 500 nm), and a compositional ratio of Al vs Ga of about 0.3:0.7, is grown. Though impurities are not doped intentionally in either of the two layers, the donor concentration in the GaAs layer 22 was about $1 \times 10^{15}$ cm$^{-3}$.

A metal film for a gate electrode, for example titanium (Ti) with a thickness of about 2 μm, is deposited upon the latter epitaxial layer described above, and is patterned into the form of a gate electrode 28, with a width of 1.5 μm, using a conventional photolithographic technique. Using this metal electrode 28 as an ion implantation mask (self-alignment), silicon (Si) ions 31 are implanted with an acceleration energy of 70 keV to a dose level of $2 \times 10^{13}$ cm$^{-2}$ (FIG. 3b). To eliminate the lattice defects generated by the ion implantation and to activate the ions, annealing was performed at 750° C. for 30 minutes. The portion denoted by 24 in FIG. 3b is this impurity-doped region. Though, to raise the ratio of the activated impurity ions annealing at a higher temperature such as 850° C. is desirable, the annealing at the temperature described above was adopted to prevent the inter-diffusion at the GaAs-AlGaAs interface and diffusion of impurities.

As donor impurities, germanium (Ge), tin (Sn), tellurium (Te), selenium (Se), sulfur (S), etc., can be used, besides silicon as mentioned above. The dose levels of the donor impurities are determined depending on the requirements for the characteristics of the semiconductor device of interest. The energy for implantation, which is different depending on the implantation species, ranges from 50 to 200 keV.

Next, the source electrode region 25 and drain electrode region 26 are formed, and are connected with the ion implanted regions by a conventional alloying method. Then, metal Al electrodes (29, 30) are formed. Thus, a field-effect transistor of the present invention is fabricated. Here, 32 denotes the carriers induced at the interface.

Furthermore, the source and drain electrode regions are formed by depositing Au-Ge alloy (200 nm)-Ni (10 nm)-Au-Ge alloy (300 nm) on the desired portions and heating in a hydrogen ambient at 400° C. for 5 min.

The field-effect transistor thus fabricated gave 1.5 times larger mobility and 3 times larger transconductance than a conventional hetero-junction transistor having an AlGaAs layer doped with about $2\times10^{18}$ cm$^{-3}$ donors.

Figure 4:
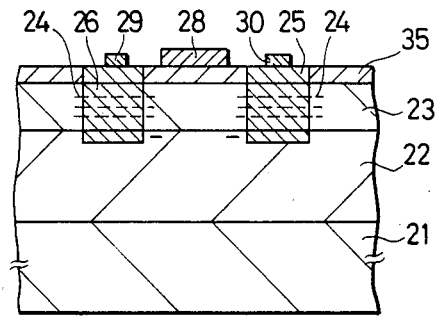
FIG. 4 shows sectional views illustrating the structure of a device of another embodiment of this invention.

It is also effective, for the enhancement of fabrication yield of the transistors, to grow a very thin GaAs layer, which is more stable than AlGaAs, upon the AlGaAs layer on the top of the semiconductor assembly. The thickness of this GaAs film is favorably 20 to 200 nm. This example is shown in FIG. 4 as a cross-sectional structure of the device. The GaAs layer 35 is formed on the AlGaAs layer 23 and protects the surface of the semiconductor assembly. The same reference characters in FIGS. 3 and 4 denote the same portions.

As described already, the present invention can be applied to materials other than the GaAs-AlGaAs system. The following will explain an embodiment using a semi-insulating InP substrate.

The basic structure is the same as that shown in FIGS. 3a–3c. A 1 μm thick undoped $In_{0.53}Ga_{0.47}As$ layer 22 and a 0.1 μm thick undoped $In_{0.40}Al_{0.60}As$ layer 23 are epitaxially grown on a highly resistive InP substrate 21. As donor impurities, tin (Sn) can be used, in addition to silicon (Si) mentioned in the above embodiment. Aluminum is used for the gate electrode 28, while the source electrode region 25 and drain electrode region 26 are formed to be connected with the ion implanted regions by an Au-Ge alloying method. Then, aluminum metal electrodes (29, 30) are formed.

Thus, a field-effect transistor of the present invention is fabricated. The carriers are induced at the interface between the $In_{0.40}Al_{0.60}As$ layer and the $In_{0.53}Ga_{0.47}As$ layer.

Furthermore, in this embodiment, other III-V semiconductors such as InAs, GaP, GaSb, etc., can be used in place of GaAs as the substrate 21, and also other III-V semiconductors and semiconductor alloys such as InAs, InSb, $Al_xGa_{1-x}As$, $In_xGa_{1-x}As$, $In_xGa_{1-x}As_yP_{1-y}$, etc., can be used as the first semiconductor layer and the second semiconductor layer.

EMBODIMENT 2

A typical example of fabricating integrated circuits on a wafer is described. In this embodiment, the elementary construction of the integrated circuit comprises enhancement-mode and depletion-mode field-effect transistors. Explanation is made by referring to FIG. 5a–FIG. 5d.

Figure 5A:
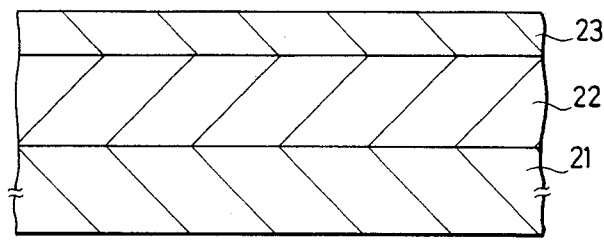
FIGS. 5a-5d show sectional views illustrating the structure of a device which illustrates a fabrication process of integrated circuits according to the present invention.

At first, as in the case of Embodiment 1, a GaAs layer 22 with a thickness of about 1 μm and an AlGaAs layer 23 with a thickness of about 120 nm are grown on the semi-insulating GaAs substrate 21 (FIG. 5a). The GaAs layer 22 and the AlGaAs layer effectively do not contain impurities, as is also the case in Embodiment 1.

Figure 5B:
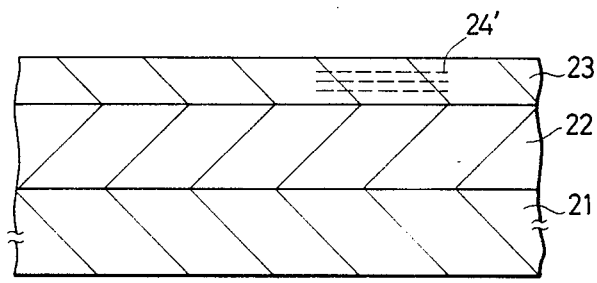
Figure 5C:
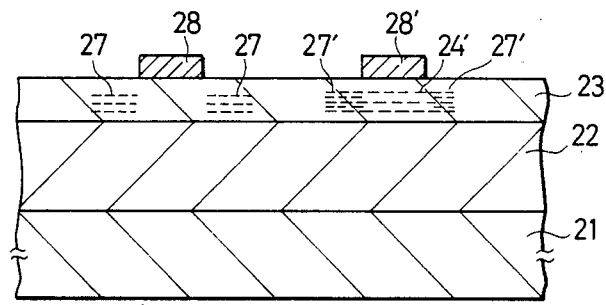

Next, silicon ions (24') are implanted into the regions where depletion-mode transistors are to be fabricated, to a dose level of $2\times10^{13}$ cm$^{-2}$ (FIG. 5b). In this procedure, implantation of ions is preferably limited to the AlGaAs layer. After the gate electrodes (28, 28') are formed, a second ion implantation is made, into the regions 27, 27'. These regions will act as ion-implanted regions of the transistors. This second ion implantation is made using the gate electrodes formed above as masks, under the same conditions as in the case of Embodiment 1, and the same annealing is made (FIG. 5c).

When implanting ions into the region to be directly beneath the gate electrode, the dose and energy range of the ions is preferably determined so that the implanted region is spaced from the semiconductor hetero-junction by more than 30 nm in the direction of the gate electrodes and to leave an unimplanted buffer layer in the AlGaAs layer.

Figure 5D:
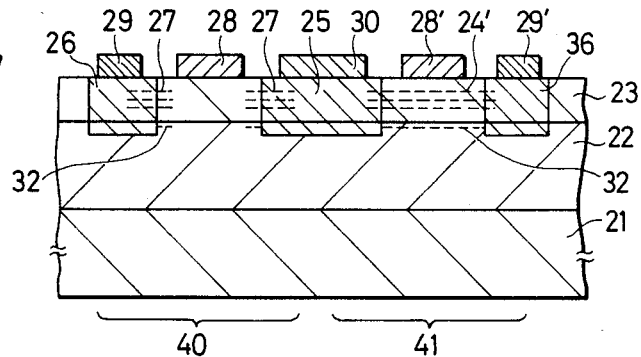

The fabrication process after this stage is the same as in Embodiment 1. That is, the electrode regions 26, 25, 36 are formed with a conventional alloying method so as to connect with the ion implanted regions 27 and 24'. Further, by forming metal electrodes 28, 29, 30, 28' and 29', the field-effect transistors are completed (FIG. 5d). In FIG. 5d, the region denoted by 40 is the enhancement-mode transistor region and the region denoted by 41 is the depletion-mode transistor region.

Furthermore, as donor impurities described above, germanium (Ge), tin (Sn), tellurium (Te), selenium (Se), sulfur (S), etc., can be used besides silicon (Si). The dose level is determined by the required characteristics, and can be in the range of $10^{12}$ to $10^{13}$ cm$^{-2}$. The acceleration energy for implantation depends upon the species implanted and, e.g., is mostly in the range 50 to 200 keV.

Moreover, the source and drain electrode regions may be formed by depositing, for example, Au-Ge alloy (200 nm)-Ni (10 nm)-Au-Ge alloy (300 nm) on the desired portions and annealing in a hydrogen ambient at 400° C. for 5 min.

Thus, by using the transistors of the present invention, semiconductor devices are very favorably integrated. That is, both the enhancement-mode and the depletion-mode transistors are fabricated simultaneously by introducing impurities only into the regions where depletion-mode transistors are required, and changing the shape of the potential well near the hetero-junction so as to shift the threshold gate voltage, in fabricating a plurality of enhancement-mode transistors of the present invention.

What is claimed is:

1. A semiconductor device comprising:
   a semiconductor substrate,
   a first semiconductor layer and a second semiconductor layer formed over said substrate, said first and second semiconductor layers forming a heterojunction at an interface between them,
   said first semiconductor layer having a relatively small forbidden band gap as compared with that of said second semiconductor layer,
   at least one pair of electrodes connected electronically to said first semiconductor layer,
   and gate means for controlling carriers in said first semiconductor layer, said gate means being located over the first and second semiconductor layers,
   wherein said device further includes first and second regions in said first and second semiconductor layers, with substantially no impurities being included in said first region, said first region being located in said first and second semiconductor layers under said gate means, and with impurities included in said second region, said second region being located in said first and second semiconductor layers adjacent to said at least one pair of electrodes.

2. A semiconductor device according to claim 1, wherein said first semiconductor layer is GaAs and second semiconductor layer is AlGaAs.

3. A semiconductor device according to claim 1, wherein said first semiconductor layer is $Al_xGa_{1-x}As$ and said second semiconductor layer is $Al_yGa_{1-y}As$ where $0<x<0.5$, $0<y<0.5$ and $x<y$.

4. A semiconductor device according to claim 1 or 2, further comprising a GaAs layer formed on said second semiconductor layer.

5. A semiconductor device according to claim 1 or 2, wherein said substrate, said first semiconductor layer, and said second semiconductor layer are either of III-V semiconductor material or III-V semiconductor alloy material.

6. A semiconductor device according to any one of claims 1, 2 and 3, further comprising an impurity region which is formed in said second semiconductor layer and which is located under said gate means, said impurity region being spaced apart from said hetero-junction at the interface between said first and second semiconductor layers.

7. A semiconductor device according to claim 4, further comprising an impurity region which is formed in said second semiconductor layer and which is located under said gate means, said impurity region being spaced apart from said hetero-junction at the interface between said first and second semiconductor layers.

8. A semiconductor device according to any one of claims 1, 2 and 3, wherein the impurity density of said first region, in the first semiconductor layer under said gate means, is smaller than $10^{17}$ cm$^{-3}$ and the impurity density of said second region in said first semiconductor layer, adjacent to said at least one pair of electrodes, is larger than $10^{16}$ cm$^{-3}$.

9. A semiconductor device according to claim 6, wherein the impurity density of said first region, in said first semiconductor layer under said gate means, is smaller than $10^{17}$ cm$^{-3}$, and the impurity density of said second region in said first semiconductor layer, adjacent to said at least one pair of electrodes, is larger than $10^{16}$ cm$^{-3}$.

10. A semiconductor device according to claim 7, wherein the impurity density of said first region, in said first semiconductor layer under said gate means, is smaller that $10^{17}$ cm$^{-3}$, and the impurity density of said second region in said first semiconductor layer, adjacent to said at least one pair of electrodes, is larger than $10^{16}$ cm$^{-3}$.

11. A semiconductor device according to claim 1, wherein said impurities included in said second region are at least one impurity selected from the group consisting of Si, Ge, Sn, Te, Se and S.

12. A semiconductor device according to claim 1, wherein said second region, having the impurities therein, is formed by ion-implanting said impurities.

13. A semiconductor device according to claim 12, wherein said ion-implanting is a masked ion-implanting, using said gate means as a mask, whereby said second region is formed in self-alignment with said gate means.

14. A semiconductor device according to claim 1, wherein said first semiconductor layer-second semiconductor layer combination is a combination selected from the group consisting of $Al_yGa_{1-y}As-Al_xGa_{1-x}As$, $GaAs-Al_xGa_{1-x}As_{1-y}P_y$, $InP-In_xGa_{1-x}-As_yP_{1-y}$, $InP-In_xGa_{1-x}As$ and $InAs-GaAs_xSb_{1-x}$, where $0<x<1$ and $0<y<1$.

15. A semiconductor device according to claim 6, wherein said impurity region is spaced apart from said hetero-junction by more than 30 nm.

16. A semiconductor device according to claim 4, wherein said GaAs layer formed on said second semiconductor layer has a thickness of 20–200 nm.

17. A semiconductor device according to claim 1, further comprising another gate means, on said second semiconductor layer, for controlling carriers in said first semiconductor layer, said another gate means being located over the first and second semiconductor layers and spaced from said gate means, and with said at least one pair of electrodes including a pair of electrodes at the sides of said another gate means; further including further first and second regions in said first and second semiconductor layers, with substantially no impurities in said further first region, said further first region being located in said first and second semiconductor layers under said further gate means, and with impurities included in said further second region, said further second region being located in said first and second semiconductor layers adjacent said pair of electrodes at the sides of said another gate means; and an impurity region formed in said second semiconductor layer and located under said another gate means but spaced from said hetero-junction, whereby depletion-mode and enhancement-mode transistors are formed on a single substrate.

18. A semiconductor device according to claim 8, wherein the impurity density of said first region, in the first semiconductor layer under said gate means, is smaller than $10^{15}$ cm$^{-3}$.

19. A semiconductor device according to claim 9, wherein the impurity density of said first region, in the first semiconductor layer under said gate means, is smaller than $10^{15}$ cm$^{-3}$.

20. A semiconductor device comprising:
a semiconductor substrate,
a first semiconductor layer substantially undoped and disposed on said substrate,
a second semiconductor layer substantially undoped and disposed on said first semiconductor layer so as to form a hetero-junction at an interface with said first semiconductor layer, and having a relatively larger forbidden band gap as compared with that of said first semiconductor layer,
a pair of impurity doped regions disposed in said second semiconductor layer,
a pair of electrodes connected to said pair of impurity doped regions, and
gate means for controlling carriers in a channel between said pair of impurity doped regions, said channel being generated in said first semiconductor layer.

21. A semiconductor device according to claim 20, wherein said pair of impurity doped regions extend into said first semiconductor layer.

* * * * *